United States Patent [19]

Isakozawa

[11] 4,451,737
[45] May 29, 1984

[54] ELECTRON BEAM CONTROL DEVICE FOR ELECTRON MICROSCOPES

[75] Inventor: Shigeto Isakozawa, Katsuta, Japan

[73] Assignee: Hitachi, Ltd., Tokyo, Japan

[21] Appl. No.: 391,917

[22] Filed: Jun. 24, 1982

[30] Foreign Application Priority Data

Jun. 24, 1981 [JP] Japan .................. 56-96509

[51] Int. Cl.³ .............................. H01J 37/26
[52] U.S. Cl. .................. 250/311; 250/306; 250/396 R
[58] Field of Search ........... 250/306, 310, 311, 396 R, 250/397, 398; 313/361; 219/121 EB

[56] References Cited

U.S. PATENT DOCUMENTS

| | | | |
|---|---|---|---|
| 3,749,964 | 7/1973 | Hirata | 250/311 |
| 3,757,117 | 9/1973 | Müller et al. | 250/396 R |
| 3,757,120 | 9/1973 | Müller et al. | 250/396 R |
| 3,801,784 | 4/1974 | Wittry | 250/306 |
| 3,835,403 | 9/1974 | Leinemann | 250/311 |
| 4,180,738 | 12/1979 | Smith et al. | 250/311 |

Primary Examiner—Bruce C. Anderson
Attorney, Agent, or Firm—Antonelli, Terry & Wands

[57] ABSTRACT

An electron beam control device for electron microscopes is disclosed in which various digital signals used for deflecting an electron beam are previously stored in a memory for each observation mode. When one of the observation modes is specified by a selector, one of the digital signals corresponding to the specified observation mode is read out from the memory to a digital-to-analog converter and is thereby converted into an analog signal.

The analog signal is supplied to electron beam deflectors to control the beam alignment.

11 Claims, 3 Drawing Figures

F I G. 1
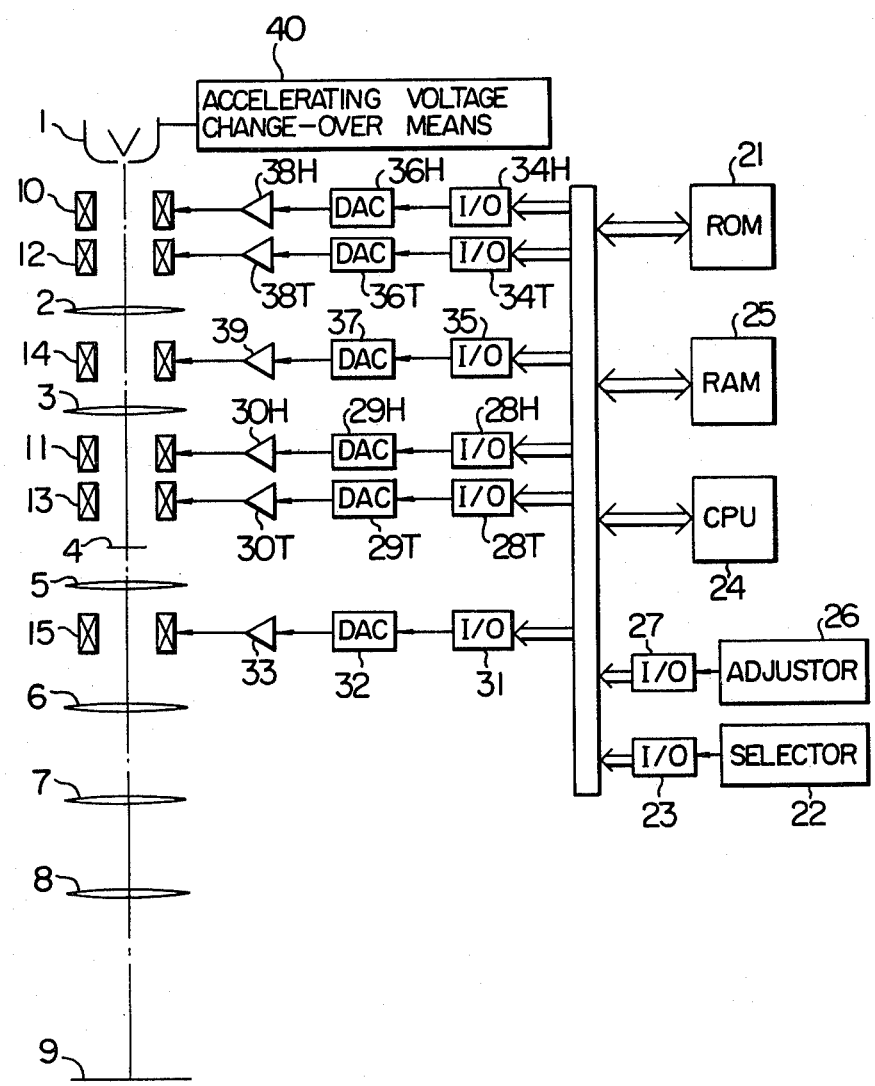

ELECTRON BEAM CONTROL DEVICE FOR ELECTRON MICROSCOPES

The present invention relates to an electron beam control device for electron microscopes, and more particularly to an electron beam control device for controlling the electron beam of an electron microscope in accordance with observation modes.

A beam alignment operation for aligning an electron beam with an optical axis of lens system is actually indispensable to an electron microscope. In general, the beam alignment is carried out in such a manner that the electron beam is horizontally moved by a first deflector and inclined by a second deflector.

However, the amount of horizontal movement as well as the angle of inclination of the electron beam given by the deflectors, are varied depending on the observation mode. Therefore, for each of the deflectors, a large number of reference power sources are required corresponding to the respective observation modes. Accordingly, there arises a problem that the cost of an electron beam control device is raised as the number of observation modes increases.

Further, since the number of controls for finely adjusting the reference power sources is increased as the number of observation modes increases, an operator may be confused by the increased number of controls so that the operability of electron microscope may be deteriorated.

An object of the present invention is to provide an electron beam control device for electron microscopes which produces no special rise in cost and causes no special deterioration in operability even when the number of observation modes is increased.

According to the present invention, various digital signals used for deflecting an electron beam are previously stored corresponding to the respective observation modes. When any one of the observation modes is specified, one of the digital signals which corresponds to the specified observation mode is read out and converted into an analog signal, so that deflection means for deflecting the electron beam is controlled on the basis of the analog signal.

Other objects and features of the present invention will become apparent from the following detailed description taken in conjunction with the accompanying drawings, in which:

FIG. 1 is a block diagram showing an electron microscope provided with an embodiment of an electron beam control device according to the present invention;

Figure 2:
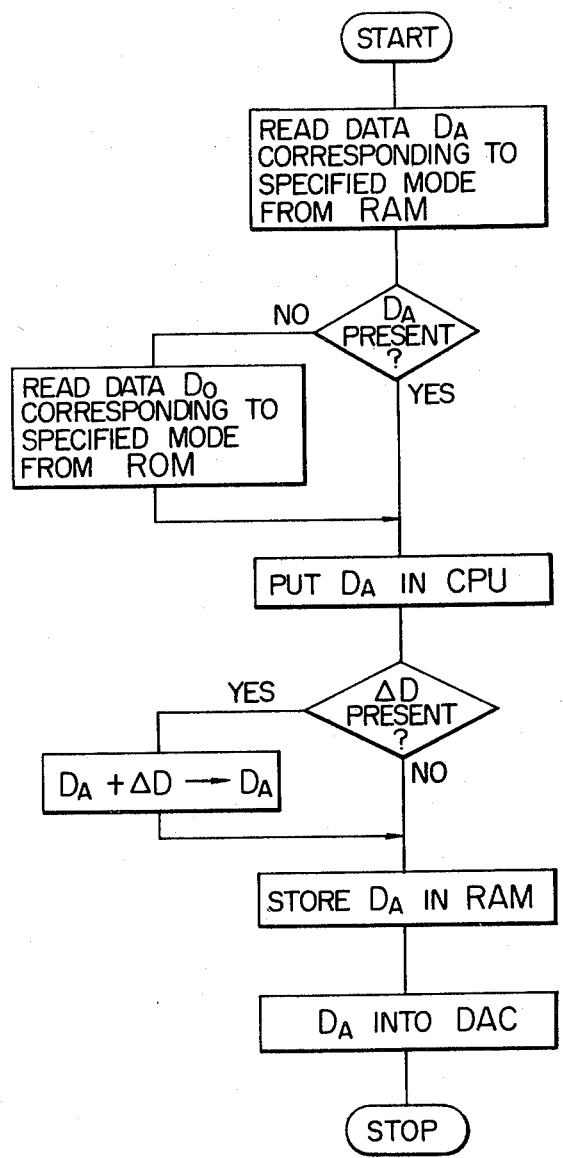
FIG. 2 is a flowchart for explaining the operation of the electron beam control device incorporated in the electron microscope shown in FIG. 1.

FIG. 1 shows an example of an electron microscope provided with an embodiment of an electron beam control device according to the present invention. Referring to FIG. 1, an electron beam emitted from an electron gun 1 is focussed on a specimen or sample 4 by a condenser lens system including a first and a second condenser lens 2 and 3. After having transmitted through the sample 4, the electron beam is enlarged at a desired magnification by an enlarging lens system including an objective lens 5, an intermediate lens 6, a first projection lens 7 and a second projection lens 8, and then projected on a fluorescent screen 9. Thus, an enlarged transmission electron microscope image of the sample 4 can be observed on the fluorescent screen 9.

A pair of electron beam deflecting means are disposed between the electron gun 1 and the first condenser lens 2 and between the second condenser lens 3 and the sample 4. The electron beam deflecting means is provided with deflection coils 10 and 11 for horizontally moving the electron beam and deflection coils 12 and 13 for inclining the electron beam, respectively. Accordingly, the beam alignment can be carried out in such a manner that the electron beam is horizontally moved by controlling currents flowing through the deflection coils 10 and 11 for horizontal movement, and is inclined by controlling currents flowing through the deflection coils 12 and 13 for inclination.

A lens coil 14 acting as astigmatism correcting means is disposed between the first condenser lens 2 and the second condenser lens 3, and further a lens coil 15 acting as astigmatism correcting means is disposed just below the objective lens 5. Accordingly, the astigmatism caused by the condenser lens system can be corrected by controlling a current flowing through the lens coil 14, and the astigmatism caused by the objective lens 5 can be corrected by controlling a current flowing through the lens coil 15.

Various observation modes are employed in electron microscopes. Representative ones of the observation modes are as follows: a bright field image observing mode, a dark field image observing mode, a diffraction image observing mode, a high dispersion diffraction image observing mode, a spot scan image observing mode, a scanning transmission electron microscope image observing mode, a microdiffraction image observing mode, a channeling pattern image obseving mode, an energy analysis image observing mode, and others.

The observation modes other than the well-known bright field image observing mode, dark field image observing mode, diffraction image observing mode and scanning transmission electron microscope image observing mode are described in the following references:

high dispersion diffraction image observing mode (Journal of Electron Microscopy, Vol. 19, 1970, P 149);

spot scan image observing mode (Journal of Electron Microscopy, Vol. 28, No. 4, 1979, P 263);

microdiffraction image observing mode (Proceedings, Thirty-Fourth Annual Meeting, Electron Microscopy Society of America, Miami Beach, Fla. Aug. 9–13, 1976, P 494);

channelling pattern image observing mode (British Patent No. 1,248,208); and energy analysis image observing mode (Analytical Laboratory, April 1981, P 20).

For the electron beam deflecting means which is disposed between the second condenser lens 3 and the sample 4 for the purpose of beam alignment, the currents flowing through the above deflecting means are required to be varied in accordance with the observation modes, since optimum currents exist for each of the observation modes. Now, explanation will be made on a manner in which the currents flowing through the electron beam deflecting means for beam alignment are controlled in accordance with the observation mode, by reference to FIG. 1. Further, refer to the flowchart shown in FIG. 2, for the better understanding of the above manner.

Digital signals for deflecting the electron beam, which differ from each other corresponding to the respective observation modes, are previously stored in a read only memory (ROM) 21 acting as a memory unit.

A selector 22 is provided to specify an observation mode and an accelerating voltage. When an observation mode is selected by the selector 22, a signal identifying the selected observation mode is sent to a central processing unit (CPU) 24 through an interface (I/O) 23. The CPU 24 judges whether or not data $D_A$ corresponding to the selected observation mode is present in a random access memory (RAM) 25 acting as a memory unit. When the data $D_A$ is present, the CPU 24 takes in the data $D_A$. On the other hand, when the data $D_A$ is absent in the RAM 25, the CPU 24 reads out data $D_O$ which is stored in the ROM 21 in the form of a digital signal corresponding to the selected observation mode, and takes in the data $D_O$ as the data $D_A$.

On the other hand, an adjustor 26 is formed of a rotary encoder. When the adjustor 26 is finely adjusted, a digital signal corresponding to the amount of adjustment is supplied, as an adjusting input $\Delta D$, to the CPU 24 through an interface (I/O) 27. The CPU 24 judges whether the adjusting input $\Delta D$ is present or not. When the adjusting input $\Delta D$ is absent, the data $D_O$ instead of the $D_A$ is sent to the RAM 25 to be stored therein. On the other hand, when the adjusting input $\Delta D$ is present, it is added to the data $D_A$, and the summation signal thus obtained is stored, as the data $D_A$, in the RAM 25. Further, the data $D_A$ thus stored in the RAM 25 is sent by the CPU 24 to a digital-to-analog converter (DAC) 29H through an interface (I/O) 28H to be converted into an analog signal, which controls a driving power source 30H. Thus, a current suited for the selected observation mode is given to the deflection coil 11 for horizontally moving the electron beam.

An interface (I/O) 28T, a digital-to-analog converter (DAC) 29T and a driving power source 30T are provided to drive the deflection coil 13 for inclining the electron beam. A current given to the deflection coil 13 is obtained in the same manner as the current given to the deflection coil 11.

As is known from the foregoing explanation, only by specifying an observation mode by the selector 22, optimum currents corresponding to the specified observation mode are given to the deflection coils 11 and 13. In this case, since optimum data for every observation mode are previously stored in the ROM 21, the cost of the electron beam control device is not raised even when the number of observation modes is increased.

Further, since the fine adjustment for the optimum currents can be made by operating the adjustor 26 irrespective of the number of observation modes, it is not necessary to increase the number of controls for fine adjustment in accordance with the number of observation modes, even when the number of observation modes becomes very large. Accordingly, the operability of the control device is not deteriorated by the increase in the number of the observation modes.

Digital signals corresponding to currents which are given to the lens coil 15 in accordance with the observation modes, are also previously stored in the ROM 21. Accordingly, when an observation mode is specified by the selector 22, an optimum current corresponding to the selected observation mode is given to the lens coil 15 in the same manner as the optimum currents given to the deflection coils 11 and 13. As mentioned previously, the lens coil 15 acts as means for correcting the astigmatism of the objective lens 5. An interface (I/O) 31, a digital-to-analog converter (DAC) 32 and a driving power source 33 are provided to drive the lens coil 15. It is a matter of course that, by operating the adjustor 26, the fine adjustment for the optimum current given to the lens coil 15 can be made in the same manner as mentioned previously.

The accelerating voltage for the electron beam is changed over stepwise by accelerating voltage changeover means 40. When the accelerating voltage is changed over, it is required to change over a current given to the deflection coil 10 which is disposed between the electron gun 1 and the first condenser lens 2 to horizontally move the electron beam, a current given to the deflection coil 12 which is disposed between the electron gun 1 and the first condenser lens 2 to incline the electron beam, and a current given to the lens coil 14 which acts as means for correcting the astigmatism of the condenser lens system. Therefore, digital signals corresponding to these currents are also stored in the ROM 21. Accordingly, when an accelerating voltage is specified by the selector 22, optimum currents corresponding to the specified accelerating voltage are given to the deflection coil 10 for horizontal movement of electron beam, deflection coil 12 for inclination of electron beam, and lens coil 14. Interfaces (I/O) 34H, 34T and 35, digital-to-analog converters (DAC) 36H, 36T and 37, and driving power sources 38H, 38T and 39 are provided to supply the optimum currents to the coils 10, 12 and 14. A process for supplying optimum currents to the deflection coils 10 and 12 and the lens coil 14 when the accelerating voltage has been changed over, is entirely the same as the process for supplying optimum currents to the deflection coils 11 and 13 and the lens coil 15 when the observation mode has been changed over. Further, the fine adjustment for the currents given to the coils 10, 12 and 14 is made in the same manner as that for the currents given to the coils 11, 13 and 15.

The ROM 21 shown in FIG. 1 may be replaced by a C-MOS RAM which is backed up by a battery. In this case, it is needless to say that two steps, one for judging the presence or absence of the data $D_A$ and the other for reading the data $D_O$ out of the ROM 21 are omitted in FIG. 2.

Figure 3:
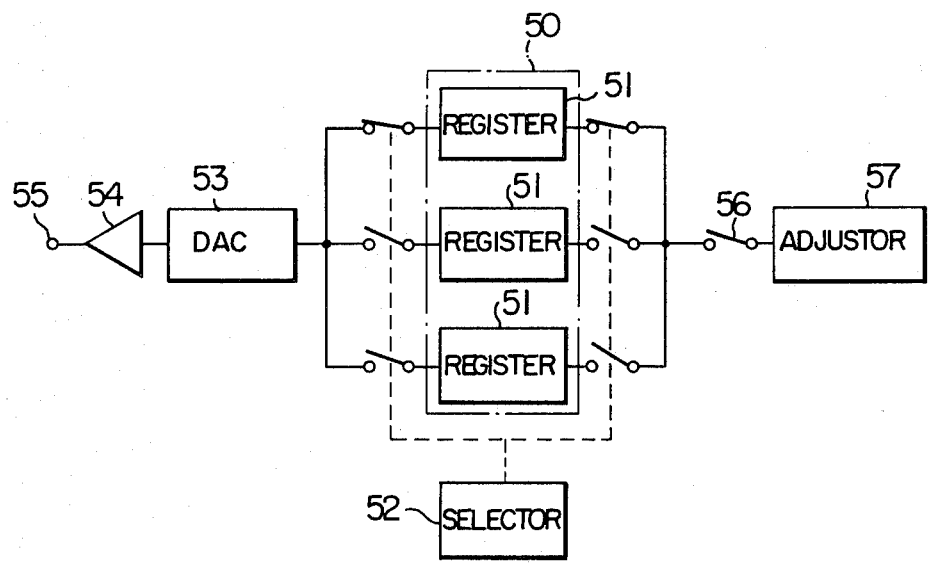
FIG. 3 is a block diagram showing a main circuit part of another embodiment of the electron beam control device according to the present invention.

FIG. 3 shows another embodiment of an electron beam control device according to the present invention. Referring to FIG. 3, a data storing unit 50 is made up of a plurality of registers or counters 51, the contents of each of which are not lost when power is turned off. Each register or counter 51 may be formed of, for example, the RCA CD4516B binary up/down counter. Further, the number of registers or counters 51 is made equal to the number of observation modes, though three registers 51 are shown in FIG. 3.

Various digital signals different from each other corresponding to the observation modes are stored in the respective registers or counters 51. Accordingly, when an observation mode is specified by a selector 52, a digital signal corresponding to the specified observation mode is read out of the storage unit 50, and is sent to a digital-to-analog converter (DAC) 53 to be converted into an analog signal. The analog signal controls a driving power source 54, the output of which is delivered from a terminal 55. On the other hand, when an adjustor 57, formed of a rotary encoder, is operated while keeping a switch 56 closed, the output of the storage unit 50 can be finely adjusted.

Although only one circuit is shown in FIG. 3 for brevity's sake, six circuits each shown in FIG. 3 are provided to drive the coils 10 to 15 shown in FIG. 1. Accordingly, the present embodiment can supply optimum currents to the coils 10 to 15 in accordance with observation modes, as in the embodiment shown in FIG. 1.

Obviously, many modifications and changes may be made by those skilled in the art without departing from the spirit of the present invention. It is therefore to be understood that the scope of the present invention is not limited to the above-mentioned embodiments.

I claim:

1. An electron beam control device for an electron microscope, comprising:
    deflection means for deflecting an electron beam;
    storage means for storing therein digital signals corresponding to observation modes for deflecting said electron beam;
    means for specifying one of said observation modes and for reading one of said digital signals corresponding to the specified observation mode out of said storage means;
    means for converting the read-out digital signal into an analog signal; and
    means for controlling said deflection means on the basis of said analog signal.

2. An electron beam control device for an electron microscope according to claim 1, wherein means for finely adjusting a digital signal which is to be read out, is provided.

3. An electron beams control device for an electron microscope including an electron gun for generating an electron beam, means for directing said electron beam to a sample to transmit said electron beam therethrough, a lens system for enlarging said transmitted electron beam and deflection means disposed between said focussing means and said sample for deflecting said electron beam, said electron beam control device comprising:
    storage means for storing therein digital signals corresponding to observation modes for deflecting said electron beam;
    means for specifying one of said observation modes and for reading one of said digital signals corresponding to the specified observation mode out of said storage means;
    means for converting the read-out digital signal into an analog signal; and
    means for controlling said deflection means on the basis of said analog signal.

4. An electron beam control device for an electron microscope according to claim 3, wherein said electron microscope includes means for changing over an accelerating voltage of said electron beam, and another deflection means disposed said electron gun and said directing means for deflection said electron beam, wherein said storage means further stores therein those digital signals for deflecting said electron beam which correspond to values of said accelerating voltage, and wherein, when said accelerating volgage is changed over, one of said digital signals corresponding to a value of said accelerating voltage obtained after the change-over is read out of said storage means to be convereted into an analog signal, and said another deflection means is controlled on the basis of said analog signal corresponding to the changed-over accelerating voltage.

5. An electron beam control device for an electron microscope including an electron gun for generating an electron beam, means for directing said electron beam to a sample to transmit said electron beam therethrough, a lens system for enlarging said transmitted electron beam, means for changing over an accelerating voltage of said electron beam, first deflection means disposed between said directing means and said sample for deflecting said electron beam, and second deflection means disposed between said electron gun and said directing means for deflecting said electron beam, said electron beam control device comprising:
    storage means for storing therein digital signals corresponding to observation modes for deflecting said electron beam;
    means for specifying one of said observation modes and for reading one of said digital signals corresponding to the specified observation mode out of said storage means;
    means for converting the read-out digital signal into an analog signal;
    means for controlling said first deflection means on the basis of said analog signal; and
    means for finely adjusting a digital signal, said digital signal being to be read out of said storage means.

6. An electron beam control device for an electron microscope according to claim 5, wherein said storage means further stores therein those digital signals for deflecting said electron beam which correspond to values of said accelerating voltage, and wherein said electron beam control device further includes means for specifying one of said values of said accelerating voltage and for reading one of said digital signals corresponding to the specified value of said accelerating voltage out of said storing means, and means for converting the read-out digital signal corresponding to said specified value of said accelerating voltage into an analog signal to control said second deflection means on the basis of said analog signal corresponding to the specified accelerating voltage.

7. An electron beam control device for an electron microscope according to claim 6, wherein said electron beam control device further includes means for finely adjusting that digital signal for deflecting said electron beam which corresponds to said specified value of said accelerating voltage and is to be read out.

8. An electron beam control device for an electron microscope including an electron gun for generating an electron beam, means for directing said electron beam to a sample to transmit said electron beam therethrough, a lens system for enlarging said transmitted electron beam, said lens system including an objective lens, means for changing over an accelerating voltage of said electron beam, first deflection means disposed between said directing means and said sample for deflecting said electron beam, second deflection means disposed between said electron gun and said directing means for deflecting said electron beam, first correcting means for correcting astigmatism of said objective lens, and second correcting means for correcting astigmatism of said directing means, said electron beam control device comprising:
    storage means for storing therein digital signals for deflecting said electron beam, said digital signals being different from each other to correspond to observation modes;
    means for specifying one of said observation modes and for reading one of said digital signals corresponding to the specified observation mode out of said storage means;

means for converting the read-out digital signal into an analog signal;

means for controlling said first deflection means on the basis of said analog signal; and means for finely adjusting a digital signal, said digital signal being to be read out of said storage means.

9. An electron beam control device for an electron microscope according to claim 8, wherein said storage means further stores therein those digital signals for deflecting said electron beam which correspond to values of said accelerating voltage and which are different from each other, and wherein said electron beam control device further includes means for specifying one of said values of said accelerating voltage and for reading one of said digital signals corresponding to the specified value of said accelerating voltage out of said storage means, means for converting the read-out digital signal into an analog signal, means for controlling said second deflection means on the basis of said analog signal corresponding to said specified value of said accelerating voltage, and means for finely adjusting that digital signal for deflecting said electron beam which corresponds to said specified value of said accelerating voltage and is to be read out.

10. An electron beam control device for an electron microscope according to claim 9, wherein said storage means further stores therein astigmatism correcting digital signals which correspond to observation modes and which are different from each other, and wherein said electron beam control device further includes means for reading an astigmatism correcting digital signal corresponding to an observation mode out of said storage means when said observation mode is specified, means for converting the read-out astigmatism correcting digital signal into an analog signal, means for controlling said first correcting means on the basis of said analog signal corresponding to said read-out astigmatism correcting digital signal, and means for finely adjusting an astigmatism correcting digital signal which corresponds to said specified observation mode and is to be read out.

11. An electron beam control device for an electron microscope according to claim 10, wherein said storage means further stores therein astigmatism correcting digital signals which correspond to values of said accelerating voltage and which are different from each other, and wherein said electron beam control device further includes means for reading an astigmatism correcting digital signal corresponding to a value of said accelerating voltage out of said storage means when said value of said accelerating voltage is specified, means for converting the read-out astigmatism correcting digital signal corresponding to said specified value of said accelerating voltage into an analog signal, means for controlling said second correcting means on the basis of said analog signal corresponding to said specified value of said accelerating voltage, and means for finely adjusting an astigmatism correcting digital signal which corresponds to said specified value of said accelerating voltage and is to be read out.

* * * * *